Sept. 11, 1962 D. W. SWANSON 3,052,957
PLATED CIRCUIT PROCESS
Filed May 27, 1957 3 Sheets-Sheet 1
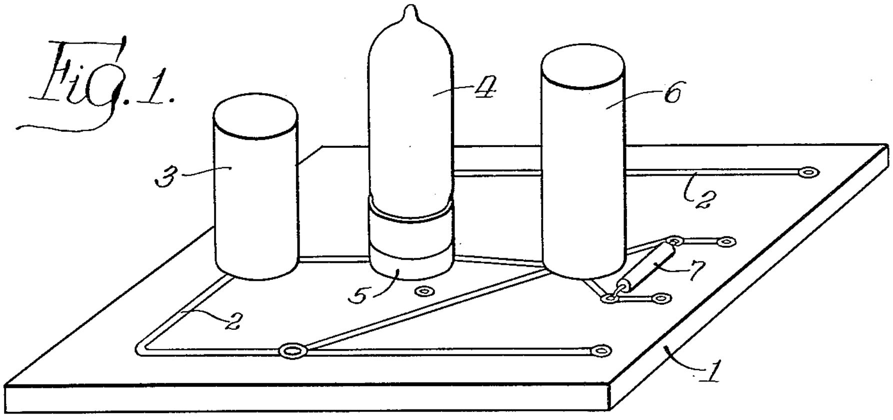
Fig. 1.
Fig. 2.
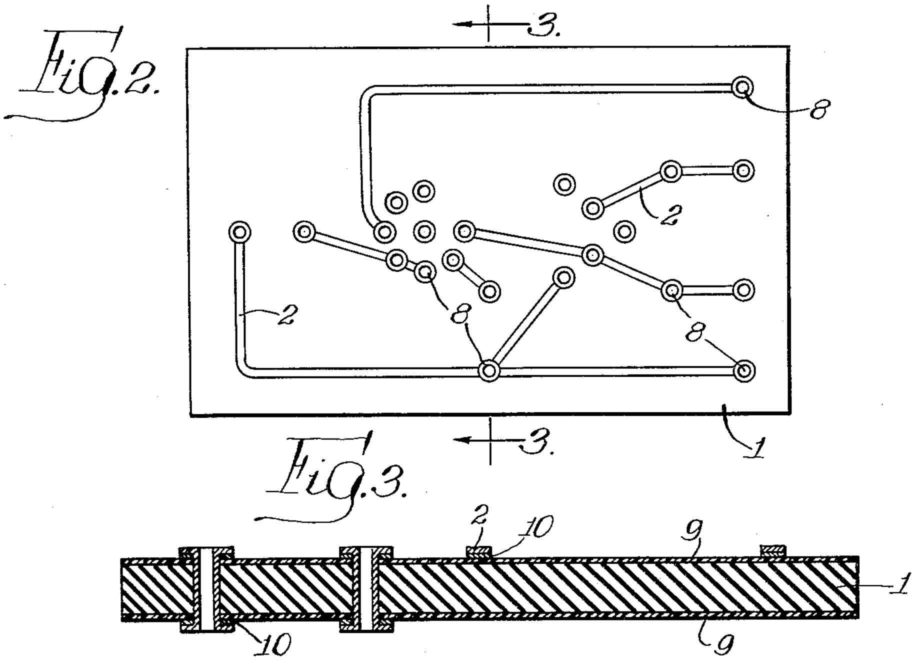
Fig. 3.
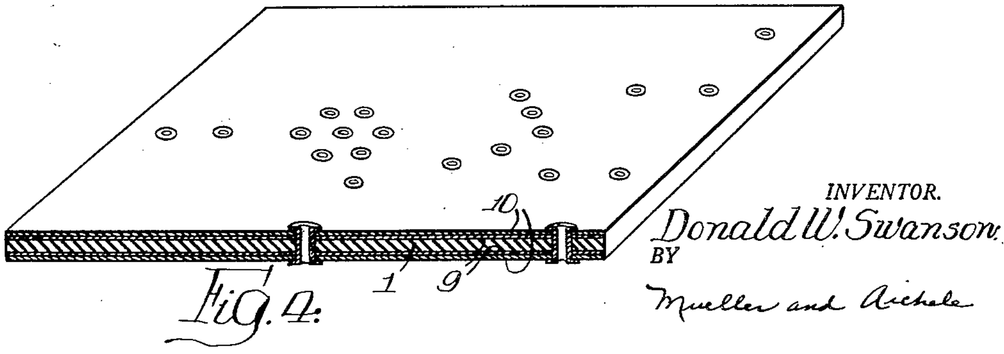
Fig. 4.
INVENTOR.
Donald W. Swanson
BY
Mueller and Aichele INVENTOR.
Donald W. Swanson
BY
Mueller & Aichele
Attys.

Sept. 11, 1962 D. W. SWANSON 3,052,957

PLATED CIRCUIT PROCESS

Filed May 27, 1957 3 Sheets-Sheet 3

INVENTOR.
Donald W. Swanson
BY
Mueller and Aichele
Att'ys.

United States Patent Office 3,052,957

Patented Sept. 11, 1962

3,052,957

PLATED CIRCUIT PROCESS

Donald W. Swanson, Chicago, Ill., assignor to Motorola, Inc., Chicago, Ill., a corporation of Illinois Filed May 27, 1957, Ser. No. 661,963
5 Claims. (Cl. 29—155.5)

This invention relates to new and useful improvements in processes for preparing printed circuit panels and more particularly to an improved process using an adhesive which is cured in distinct stages to produce printed circuit panels on which the conductors are firmly retained and protected against electrical leakage and against separation from the panels during soldering.

The present application is a continuation-in-part of copending application Serial No. 628,889, filed December 17, 1956, now abandoned.

In recent years, substantial improvements have been made in the manufacture of electrical equipment by using printed circuit panels. The use of such panels has resulted in substantial economies in direct labor and in reduced overhead. These panels are generally formed of a thermosetting resin laminate and provided with an electric circuit design which is supported on and flush with the surface of the panel. The manufacture of printed or plated circuit assemblies that are suited for general use in the electronic arts has proved to be more difficult than originally appeared. In the manufacture of printed or plated circuits, there is usually provided an insulating panel on which metal conductors are printed or plated in the form of thin, flat metal conductors which are supported on the panel. In the securing of the electric conductors on the surface of printed circuit panels, a serious problem has arisen in providing satisfactory adhesion between the metal conductors and the insulated supporting panel. The insulating panel is generally formed of a resin laminate which is usually very glossy and provides rather poor adhesive properties. In earlier work which was done on the preparation of plated circuit panels, the panels were roughened by a mechanical means such as sandblasting to provide a surface to which the metal conductors could adhere. The roughening of the surface of an insulating panel, however, has sometimes been at the expense of the electrical insulating characteristics of the surface. The loss in insulating characteristics of the surface of plastic panel boards arises from the fact that the roughening of the surface renders the surface subject to moisture absorption which produces substantial electrical leakage between the metallic conductors of the plated circuit.

Another method for providing proper adhesion between metallic conductors and an insulating panel is to apply a layer of an adhesive to the surface of the panel to secure the conductors thereon. Adhesives which have been used have not exhibited sufficiently high adhesion to both the panel surface and the metal conductors to be effective. Furthermore, adhesives which have previously been used have often overcured or cured too soon in the various process steps in which the plated circuit panel was made to be effective.

It is, therefore, one object of this invention to provide an improved process for the preparation of printed circuit panels in which the desired adhesion may be obtained between the metallic conductors and the panels without loss of electrical insulating properties of the panel.

Another object of the invention is to provide an improved process applying and curing an adhesive for retaining a metal coating on an insulated panel.

Still another object of the invention is to provide an improved process for affixing a conductive metal coating to an insulating panel in such a way that selected portions of the metal coating may be removed easily during the process while other portions of the coating are firmly held to the insulating panel.

One of the features of this invention is the provision of a process for the manufacture of printed circuit panels using an adhesive consisting of a thermosetting resin modified with rubber or synthetic rubber as a coating for a printed circuit panel which adhesive will adhere to the panel and will be only partially cured during the formation of the metal conductors thereon.

Another feature of this invention is the provision of a process using an adhesive which is cured in successive stages by the various process steps which are used in the fabrication of the printed circuit panel and which reaches a substantially fully cured state during the soldering of components on the completed printed circuit panel.

Still another feature of this invention is the application of a conductive metal coating to a partially cured adhesive layer and the removal of selected portions of this coating from the adhesive layer while it is still in a partially cured condition.

Referring now to the drawings:

FIG. 1 shows in perspective a completed printed circuit panel with electronic components assembled thereon;

FIG. 2 is a plan view of the printed circuit panel shown in FIG. 1 showing only the conductors and terminal connections on the panel;

FIG. 3 is a cross-sectional view taken along the line 3—3 of FIG. 2 showing conductors secured on the surface of and extending through the bores of holes in the insulated panel;

FIG. 4 is a perspective view partially in cross-section showing a printed circuit panel punched with holes and provided with a coating of adhesive and a metal film as applied in the initial steps of this process;

Figure 5:
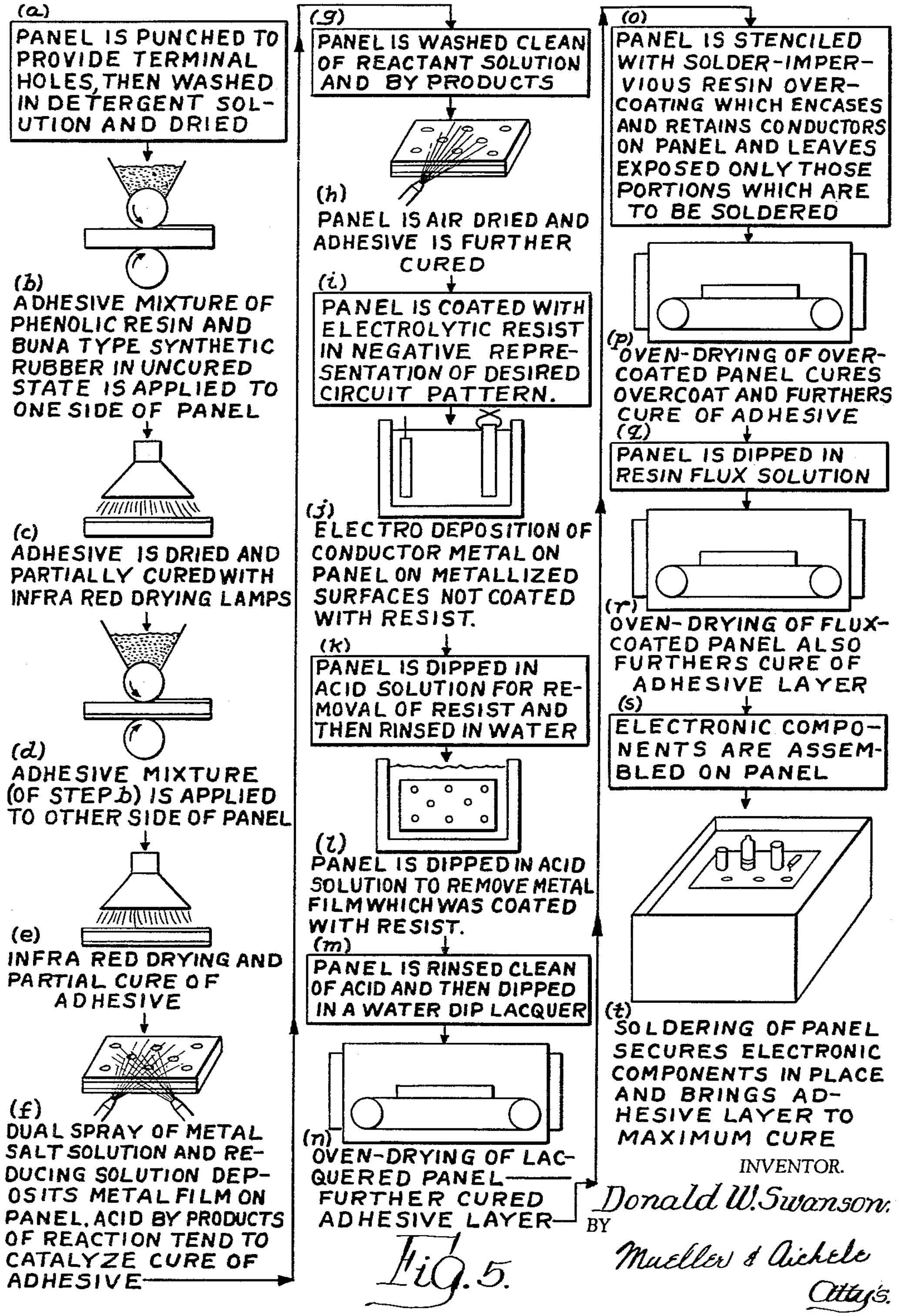
FIG. 5 is a schematic view showing in succession the various process steps for the preparation of a printed circuit panel and assembly and soldering of electronic components thereon.

The invention concerns an improved process for securing adequate adhesion of a metal coating to an insulated panel in the preparation of a printed circuit panel. In this process, an adhesive having an uncured stage, a partially cured stage and a fully cured stage is applied to an insulated panel. The adhesive, when dried and partially cured, is capable of receiving and tenaciously holding a metal layer but does not hinder subsequent removal of selected portions of the metal layer. In subsequent processing steps required in the preparation of a printed circuit panel, the adhesive undergoes further curing so that it can be brought to a fully cured state by the application of heat during the soldering or similar affixation of electronic components on the completed panel.

In FIG. 1 of the drawings, there is shown in perspective a plated circuit panel assembly which includes an insulated panel 1 which may be a thermosetting resin laminate such as phenolic paper laminate or a fiberglassepoxy resin laminate. In most printed circuit constructions, an XXXP phenolic laminate is used since it is more susceptible to cold punching. The insulated panel 1 has a plurality of conductors 2 formed on the surface thereof which define any desired electric circuit which, in this case, is the circuit for a simple power supply. In the circuit shown in FIG. 1, there is a condenser 3, a rectifier tube 4 having a tube socket 5, an electrolytic condenser or filter 6, and a resistor 7.

In FIG. 2 of the drawings, there is shown a plan view of a completed printed circuit panel having the complete layout of conductors required for the power supply circuit including the electronic elements disclosed in FIG. 1. In this figure, there are shown the panel 1 and conductors 2 together with a plurality of holes 8 which have metal electrolytically deposited therein to provide terminal connections for the various electronic components used in the circuit.

In the preparation of this printed circuit panel, the first step is the punching of a plurality of holes in the panel corresponding to the desired configuration of holes as shown in FIG. 2. As was previously pointed out, the material used for the panel is preferably an XXXP phenolic laminate and is punched using one or more punch assemblies which will produce the desired configuration of holes in the panel, and using a high capacity press such as a 50-ton "Dennison" hydraulic press. Following the punching step, the panels are washed in water using a detergent to remove any dust or particles broken loose during the punching operation and also to remove any oily deposits on the surface which might interfere with the adhesion of the conductors to the panels. The panels are then air-dried and passed on for further processing.

Following the washing and drying steps, the panels are coated with an adhesive layer 9 on both sides and dried as illustrated in steps *b, c, d,* and *e,* in FIG. 5 and in FIG. 4.

In accordance with this present invention, the adhesive applied is a water-insoluble, thermosetting resin which is cured relatively slowly in stages. Certain epoxy composition, phenol-formaldehyde resins, rubber adhesives and rubber-modified phenolic resins are generally suitable although certain specific compositions are preferred.

The adhesive which it is preferred to apply to the panel is phenol-formaldehyde type resin which is modified with a substantial amount of a buna synthetic rubber. The phenolic-synthetic rubber adhesive provides adhesion both to the phenolic base and to the metal layer which is subsequently applied to the panel. The adhesive is applied in the form of an emulsion in a solvent which comprises a mixture of 89% methyl ethyl ketone, 10% isopropyl alcohol and 1% isophorone. The solids content of the adhesive average about 20% by weight and the density of the adhesive emulsion averages about 7.3 lbs. per gallon. This adhesive has several stages of curing during which it continues to polymerize and provide a firmer bond with the phenolic panel and with the metal conductors thereon. The first stage of cure of this adhesive will be referred to as stage "A" which includes the adhesive in a completely uncured stage and ranging up to a partially cured state. In stage "A," the adhesive is soluble in both alcohols and ketones. In the second stage of the cure of this adhesive, which is referred to as stage "B," the adhesive is partially cured and is soluble in ketones, but is insoluble in alcohols. A cure of the adhesive beyond stage "B" produces a thoroughly cured stage, and is attained only after exposure to a temperature of about 450° F. for about 5 minutes or after a very long period of time (more than one hour) at a lower temperature (e.g., 350° F.). This adhesive in the fully cured stage is insoluble in both alcohols and ketones.

In steps *b, c, d,* and *e,* the panels first have the adhesive applied on one side using any suitable applicator such as a roller applicator which will apply a uniform coating of adhesive to the panel. When the panels are coated on one side, they are placed on a conveyor and passed under a series of infra red drying lamps which cause most of the solvent to be evaporated from the adhesive leaving a firm but resilient coating on the panel. The panel is then turned over and a coating of adhesive applied on the other side and passed on a conveyor under the infra red drying lamps to provide a firm but resilient layer of adhesive on that side of the panel. In the step of drying the solvent from the adhesive, the adhesive is cured from stage "A" partially into stage "B."

After the adhesive film is applied to both sides and dried, the panels are passed through a metallizing step and washed and dried as shown in steps F, G, and H, of FIG. 5. In the metallizing step, a very thin continuous metal film is applied over the entire surface of the adhesive-coated panel and on the surface of the holes through the panel by subjecting the panel to a mixture of a metal salt solution and a reducing solution. If the metallized layer over the adhesive is to be silver, the panels are first sprayed with a sensitizing solution in the form of a stannous chloride ($SnCl_2$) followed by a spray wash to remove all but a trace of the sensitizer. The panel is then subjected to a dual spray of a silver salt and a reducing solution which precipitates a film of silver on the panel.

If the metallized layer over the adhesive is to be copper, the panels are first treated with a sensitizing spray of stannous chloride ($SnCl_2$) and washed to remove all but a trace of the sensitizing solution. The panels are then sprayed with a solution of a salt of a noble metal which is operable to catalyze the deposition of metal on the surface of the panel. The catalyst salt which is used is preferably silver nitrate but may be any one of a number of salts of noble metals such as $PtCl_2$, $PdCl_2$, $AuCl_2$, or the like.

Following the application of the catalyst solution, the panels are subjected to a dual spray of a reducible copper salt, such as copper acetate and a reductant, such as sodium hydrosulphite ($Na_2S_2O_4$) which produces an almost instantaneous reaction depositing a copper film on the surface of the panels. This process of copper metallizing printed circuit panels is described more fully in the co-pending application of Donald W. Swanson, Serial No. 538,906, filed October 6, 1955. During the metallizing step, there is produced a thin layer 10 of silver or copper over the entire surface of the panels including the bores of the holes therethrough. At the same time, there are produced acid by-products (with a pH less than 3.5) of the metallizing reaction which have a tendency to catalyze the polymerization of the adhesive coating 9 further into stage "B" of the polymerization to some extent. The period of exposure of the adhesive to these acid by-products is about one minute.

Although it is preferred to deposit the conductive layer 10 by a reduction step of the type described, deposition of metal by other known means, such as condensation of vaporized metal, is also within the scope of the invention. The absence of acid by-products in alternative metal deposition processes does not materially effect the cure of the adhesive since the panel is subsequently subjected to sufficient heat curing to carry out the polymerization to the desired degree.

Whatever method of metal deposition be used, the adhesive layer 9 must be in a partially cured state. If no curing at all has been effected, a non-uniform layer, incapable of adhering to the panel, will be formed. However, if the adhesive be completely cured, it will not receive the metal deposit any better than the insulating panel itself.

Figures 6, 7:
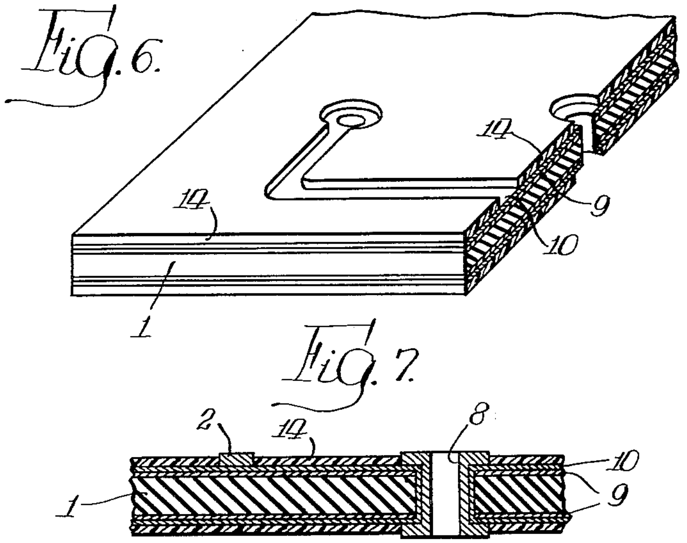
FIG. 6 is a sectional view of a portion of a panel with the electrolytic resist applied and ready for the electrodeposition of conductors thereon.
FIG. 7 is a sectional view of a portion of a panel with the electrolytic resist thereon and with metallic conductors plated into and filling the space where no electrolytic resist was applied.

After the surface of the panel has been completely metallized by the steps thus described, the panel is washed and dried with hot air (which furthers the cure of the adhesive into stage "B"). The panel is then coated with an electrolytic resist 14 (see FIG. 6) in a negative representation of the desired circuit pattern. The resist may be applied as taught in U.S. Patent 2,699,425 of Temple Nieter (assigned to the assignee of the present application) using a silk screen stencil or by any other suitable method. The stencil used is preferably a silk screen type stencil having a screen portion with a pattern blanked off thereon in the same pattern as the desired printed circuit. Using the stencil, an electrolytic resist 14 is applied to the panel as a coating which has a pattern which is the negative of the desired printed circuit pattern. The resist therefore covers all of the metallized surface 10 of the panel except the portions on which metal is to be deposited. A portion of a panel showing the adhesive and metal layers with the resist applied is shown in FIG. 6.

After being coated with a thin metallic layer 10 of copper and with an electrolytic resist the panel is supported by a clip in an electroplating bath consisting essentially of an acidic solution (with a pH less than 1.0) of a copper salt. Another electrode of copper is suspended in the solution and copper is electroplated on the panel 1 for a period of 15–45 minutes upon the portions of the metallized surface layer 10 thereof which are not covered by the resist 14. A substantial thickness (about .001 inch) of copper is thus built up in the pattern determined by the resist 14. In FIG. 7 of the drawings, there is shown a section of the panel with the resist 14 thereon and showing the conductors 2 which have been plated upon the metallized surface 10 as determined by the pattern of the resist 14. It should be noted from FIG. 7 that the holes 8 through the panel are coated with copper which has been electrolytically deposited therein and thus providing terminal connections for electronic components and a means for interconnecting portions of the circuit on opposite sides of the panel. More details as to the method of forming circuits on the opposite sides of the panel and connecting them through plated holes are to be found in the aforementioned Nieter patent.

Electrodeposition from an acid bath is the preferred method of applying the conductive pattern in accordance with the present invention. However, electrodeposition from neutral or alkaline solution may also be employed.

After the desired pattern of conductors has been electrodeposited on the panel as determined by the pattern of the resist 14, the panels are dipped for 3 to 6 minutes in an acid solution which dissolves the resist material but which does not attack the metal conductors which have been deposited electrolytically on the panel. A panel with the resist removed showing the conductors 2 deposited on the metallized surface and through the holes in the panel is shown in FIGS. 2 and 3 of the drawings. The acid solution used consists of a mixture containing 90% concentrated sulfuric acid and 10% glacial acetic acid. This acid solution has a tendency to catalyze the curing of the adhesive in the event any of it penetrates to the adhesive layer 9. However, this effect is not relied upon to further the cure of the adhesive so that resist materials which are stripped by agents other than acids may also be used.

The panels are then removed from the acid solution which has dissolved the electrolytic resist and are rinsed either by a dip rinse or by spray rinsing. The rinsed panels are then dipped for about 30–60 seconds in a concentrated acid solution which dissolves the metallized layer 10 of copper on the portions of the panel which were covered by the resist. This acid dip also dissolves a small portion of the conductors which have been electrolytically deposited on the panel but the panels are removed before the conductors are appreciably affected. The acid solution which is used to remove the copper layer or film on the panels is preferably an oxidizing acid, such as acetic or phosphoric acid. As in the resist removal step, the acid has a tendency to catalyze further curing of the adhesive if it makes contact with adhesive layer 9 but, again, such tendency is not relied upon to effect curing. Any suitable oxidizing reagent which will dissolve copper, e.g., $FeCl_3$ or $Ft(ClO_4)_3$, may also be used for removing the copper film which was covered by the resist.

At this stage of the process, it is important that the adhesive be only partially cured. If the panel is heated to fully cure the adhesive at this stage, surface oxidation of the copper conductors will take place. Also, when certain adhesives are used, if polymerization proceeds to stage "C," the bond between the adhesive layer 9 and the metallic coating 10 will be so tenacious that removal of selected portions of the coating 10 to isolate the various conductors of the circuit will become very difficult. This will either result in defective circuits subject to short circuiting or necessitate use of undesirably drastic measures to remove the selected portions of metal coating 10.

From the acid bath, the panels are removed and spray rinsed or dip rinsed and passed on to a water dip lacquer. The panels are dipped in the water dip lacquer which coats the panels and removes the water therefrom which settles in droplets to the bottom of the lacquer tank. The lacquer is applied as a temporary protective coating and permits further heat curing of the adhesive during drying of the lacquer. If the panels were heated to an effective curing temperature before application of the lacquer, an undesired oxide film would be formed on the surface of the copper conductor. The water dip lacquer is commercially obtained type, known as Lonco Seal Brite No. 230–10F, manufactured by the London Chemical Co. of Chicago, Illinois. From the lacquer tank, the panels are passed through a drying oven at about 150–200° F. for 5–10 minutes, where the lacquer is thoroughly dried and the adhesive layer is further cured in stage "B" of its cure.

After being coated with the water dip lacquer, the panels are often inspected with the lacquer serving to protect the conductive pattern. The panels are then provided with a selectively applied resin overcoat which is impervious to solder. The resin overcoat may be applied through a silk screen stencil which is blocked off at selected points so that the resin overcoat will be applied to the entire panel except at selected points where it is desired that solder may contact the conductors or the metal lined holes through the panel. The resin which is applied through the silk screen stencil to the panel is an adhesive coating which covers the surface of the panel and extends over the portions of the metal conductors other than those blocked by the stencil screen and thus is operable to retain the conductors on the surface of the panel and reduce any tendency towards delamination of the conductors. The resin overcoat is also operative as an insulator and reduces electrical leakage between the conductors on the panel.

The resin overcoat which is used is preferably a melamine base resin such as a butylated melamine-formaldehyde resin in a solvent. The resin in a solution is thin and tends to run and is therefore mixed with a thixotropic agent which gives it a gelatinous consistency such that it may pass through the stencil readily but does not run after contacting the surface of the panel. Thixotropic agents which may be used for this purpose include that marketed under the designation "Cabosil" which is manufactured by the Geoffrey L. Cabot Company of Cambridge, Massachusetts, or that marketed under the designation "Santocel" which is manufactured by the Monsanto Chemical Company, or any other well known type. While the preferred resin used is a melamine formaldehyde resin such as that marketed under the designation "Resmene" No. 975 supplied by Monsanto Chemical Company, other melamine resins may be used. Other successful printed circuit assemblies have been formed by using other coating resins such as polyester resin manufactured by the Celanese Corporation and marketed under the designation "MX179" polyester resin marketed under the designation "Laminac" No. 4233 and 4332 (modified with antimony trioxide as a fire retardant) manufactured by Cyanimide Company; various combinations of melamine, phenolic and silicon resins, epoxy resins, alkyd modified melamine resins, melamine resins modified with urea formaldehyde resins, and melamine resins modified with polyvinyl butyrals. The thermoplastic resins are operative but are not preferred since they are not as resistant to molten solder as the thermosetting resins.

Figure 8:
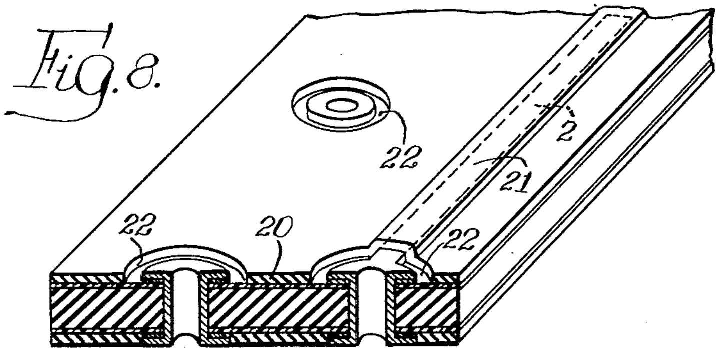
FIG. 8 is a view in perspective and partially in cross-section of a portion of a printed circuit panel with the conductors secured thereon and a resin overcoat applied and hardened.

The resin overcoat 20 may be cured in air at room temperature but cures very slowly under these conditions. These resin overcoats may be cured at elevated temperatures, e.g. in a convection oven at about 200°–250° F. for about 30–60 minutes. It is also possible to use infra red drying ovens which may speed up the setting of the resin to a much shorter period of time. There are no fixed temperatures or times for the curing of these resins since the purpose is merely to dry and set the resin. When the resin is dried in a convection oven or using infra red heat lamps, the heat which is applied for curing the resin overcoat is also operative to cure further the adhesive layer 9. The adhesive layer 9, at this point, is cured well into stage "B" of the polymerization. In FIG. 8 of the drawings there is shown a section of the printed circuit panel with the resin overcoat layer 20 applied to the panel and coating the metal conductors as at 21 but having open spots 22 leaving exposed selected portions of the metal conductors and the metal lined holes corresponding to the blocked portions on the stencil through which the overcoat was applied.

After the resin overcoat has been applied and baked on, the panels are dipped in a resin solution and oven dried. This application of a resin solution which is dried on the panels provides a film of resin over the entire panel which acts as a flux for the portions of the metal conductors on the panel and the metal lined holes which are to be soldered. After the application and drying of the flux coating the printed circuit panel is complete and ready for assembly of components thereon. The oven drying (for about 10–30 minutes at 150°–200° F.) of the flux coating furthers the cure of the adhesive layer 9 into stage "B" and causes it to reach the most advanced state of cure obtained during the manufacture of the panel.

It is thus seen that the adhesive coating which was applied in steps *b* and *d* (of FIG. 5) is cured from the uncured to the partially cured stage (stage "B") in steps *c* and *e*. In each of the steps *h, n, p, r,* and *t*, the coated panel is heated and the adhesive further cured. The time and temperature specified for the performance of the steps of this process are not critical with respect to the cure of the adhesive but rather represent the practical limits for the performance of those steps to realize the primary function of the step (such as plating, stripping of resist or metal, drying or curing of resinous overcoating etc.). Similarly, the time interval between the performance of the process steps does not materially affect the cure of the adhesive. If there is a delay between the performance of the adhesive coating and metallizing steps the coated panels should be protected against dust or foreign particles in the air. Similarly, if there is a delay between the metallizing and plating steps or between the plating and acid stripping steps the panel should be stored in a non-corrosive atmosphere to avoid the formation of undesirable oxides on the copper surfaces. These precautions, however, relate to the maintaining of clean electrically conductive surfaces and are not necessary for controlling the cure of the adhesive coating.

The curing of the adhesive coating on the printed circuit panel is never complete at room temperature. A partially cured stage is obtainable at moderate temperatures (e.g. 150°–250° F.). A fully cured stage for the adhesive coating may be obtained by heating to 450° F. for 5 minutes or by heating to higher temperatures (e.g. 550° F.) for a shorter time (e.g. 5–10 seconds) or to a slightly lower temperature (e.g. 350° F.) for an hour or more.

The completed printed circuit panel may be provided with electronic components such as tubes, condensers, and resistors as described in connection with FIG. 1. In the case of certain components such as resistors and condensers, the terminals or terminal wires are inserted directly into the metal lined holes 8 on the printed circuit panel. In the case of tubes, there is usually provided a separate tube socket which has its own terminals which fit the metal lined holes on the panel. The various components are assembled on the printed circuit panel with their terminals and terminal wires extending into the metal lined holes which will provide the proper electrical connections. The printed circuit panel with the various components assembled thereon is then ready for soldering by any one of several soldering techniques. For instance, the panels may be soldered by automatic soldering machines in which a printed circuit panel is moved by an automatic conveyor arrangement to a position over a soldering tank where a solder-carrying tray is moved upwardly to carry solder into contact with the underside of the panel. When the panel is contacted with the solder the solder adheres to the exposed metal conductors and metal-lined holes on the underside of the panel and moves upwardly by capillary action through the metal-lined holes to provide a solid mechanical and electrical joint for the terminal connections and wires extending into said holes. In this soldering operation, the solder contacts only the exposed portions of the metal conductors and the metal-lined holes which are not coated with the resin overcoating. In the soldering step the panel is in contact with solder at 500° F. for 5–10 seconds, which raises the temperature of the panel to the point required for furthering the cure of the base adhesive layer 9 past stage "B" of polymerization to a substantially fully cured stage.

Soldering may also be accomplished by moving the panels over a moving hump-shaped mass of molten solder wherein the top of the hump is at a position to engage the conductors on the lower surface, or the conductors in the bores of the holes. Moving along or upon such metal, the solder wets all of the parts to be soldered on to the panel and when it cools and hardens the components are positively secured and in each instance the heat from the soldering completes the curing.

Figure 9:
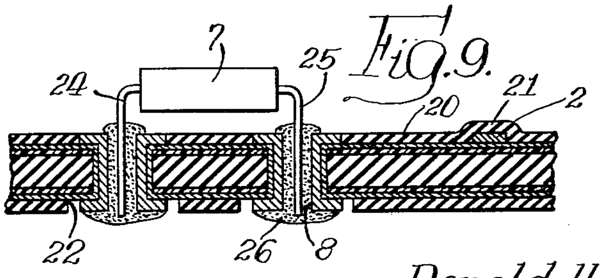
FIG. 9 is a cross-sectional view of part of a printed circuit panel after the panel has been completely prepared and electronic components assembled and soldered thereon.

In FIG. 9 of the drawing, there is shown an enlarged sectional view of part of a printed circuit panel after soldering. The metal conductors 2 are secured on the panel by the adhesive layer 9 and encased in the resin overcoat 10. A resistor 7 has its lead wires 24 and 25 inserted in metal-lined holes 8 and secured in place by solder connections 26.

While this process has been described with particular emphasis on silk screen techniques for applying the resist and the resin overcoat, it should be understood that other techniques for selectively coating panels could be used and should be considered within the scope of this invention.

I claim:

1. A process for forming a printed circuit on an insulating panel which comprises, applying continuously over at least one surface of the panel an adhesive composition comprising phenolic resin, synthetic rubber, and a vaporizable solvent, said adhesive composition being applied in an uncured stage and having a partially cured stage and a fully cured stage, heating the adhesive-coated panel to remove most of the solvent by evaporation and to partially cure the adhesive to a stage wherein the adhesive is adherent both to the insulating panel and to precipitated metal, subsequently reacting a metal salt solution and a reducing solution on said partially cured adhesive to form a first metal layer of sufficient electrical conductivity for subsequent electroplating, applying to said first metal layer an electrolytic resist in a pattern which is a negative representation of the desired circuit pattern, electroplating metal on the portions of said first metal layer not coated with said resist to form conductors on the panel in the desired circuit pattern, removing the resist and that portion of the first metal layer covered thereby, subsequently applying heat to the panel in preparing the panel for soldering operations, and which preparation includes the step of providing electrical components on one side of the insulating base such that portions of the components on said base are solderable to portions of the conductors, and further applying heat to the base over the entire area which corresponds to the circuit pattern from a volume of molten solder from which solder is applied to the solderable portions of the assembly, with the heat from the molten solder curing the adhesive material to a degree which makes a useable final circuit assembly.

2. A process for producing a circuit assembly by depositing metallic material on adhesive material provided on an insulating base, with the adhesive material being conditioned during the process so that it secures the metallic material to the base as the metallic material is deposited and thereafter, said process comprising applying continuously over a surface on at least one side of the base a thermosetting, water-insoluble adhesive material which is in an uncured stage at the time it is applied, heating the adhesive coated base at a temperature and for a time sufficient to partially cure said adhesive material to a condition in which it is adherent both to the insulating base and to metallic material, subsequently precipitating metallic material on said partially cured adhesive material to form a continuous metallic layer on said base of sufficient electrical conductivity for subsequent electrodeposition thereon, with the partially cured adhesive material securing the metallic material to the base as it is deposited, masking selected portions of said metallic layer so as to leave exposed other portions of said layer which represent a desired circuit pattern, electrodepositing conductive metal on the exposed portions of said metallic layer so as to form electrical conductors on the insulating base in the desired circuit pattern, selectively removing the masked portions of the metallic layer from the base, preparing the assembly of the insulating base and the conductors thereon for a soldering operation which preparation includes the step of providing electrical components on one side of the insulating base such that portions of the components on said base are available to be soldered to portions of the conductors, and applying heat to the insulating base over the entire area which corresponds to the circuit pattern from a volume of molten solder from which solder is applied to the solderable portions of the assembly, with the heat of the molten solder curing the adhesive material underlying said conductors to a degree which makes a useable circuit assembly.

3. A process for producing a printed circuit assembly by depositing metallic material on adhesive material provided on an insulating base with the adhesive material being conditioned during the process so that it firmly secures the metallic material to the base as it is deposited and thereafter, said process comprising applying continuously over a surface on at least one side of the insulating base a thermosetting, water-insoluble adhesive material which contains a vaporizable solvent and which is in an uncured condition at the time it is applied, heating the adhesive coated base for a time and at a temperature sufficient to evaporate solvent from the adhesive material and to partially cure the adhesive material on the base to a condition in which it is adherent both to the insulating base and to metallic material, subsequently reacting a metal salt solution and a reducing solution on said partially cured adhesive material to form thereon a continuous metallic layer of sufficient electrical conductivity for subsequent electroplating thereon, with the partially cured adhesive material securing the metallic material to the base as the layer is formed, providing masking material on selected portions of said metallic layer in a pattern which is a negative representation of a desired circuit pattern, electrodepositing conductive metal on the portions of said metallic layer not covered by said masking material so as to form electrical conductors on the insulating base in the deisred circuit pattern, removing the masking material and those portions of the metallic layer covered thereby from the base, preparing the assembly which includes the insulating base and the conductors for a soldering operation with such preparation including the step of providing electrical components on one side of the insulating base such that portions of the components are available to be soldered to portions of the conductors on said base, and contacting the other side of the insulating base over the entire area corresponding to the circuit pattern with molten solder which establishes connections between the electrical components and the conductors on said base, with the molten solder heating the assembly sufficiently to advance the cure of the adhesive material underlying said conductors to the final stage of cure achieved in the processing, thereby ensuring that the adhesive material is cured sufficiently upon completion of the soldering to provide a useable circuit assembly.

4. A process for use in producing a printed circuit assembly whereby metallic material which is deposited on an insulating base is secured to the base by adhesive material during and after deposition of the metal, said method comprising applying continuously over at least one side of the insulating base a thermosetting adhesive material which is in an uncured condition at the time it is applied to the base, heating the adhesive coated base at an elevated temperature for a time sufficient to partially cure the adhesive material to a condition in which it is adherent both to the insulating base and to metallic material, subsequently forming a continuous metallic film on said partially cured adhesive material by chemical metallization, with the partially cured adhesive material firmly securing the metallic material to the base while the metallic material is being deposited and thereafter, masking selected portions of said metallic film so as to leave predetermined areas of said film exposed, with the exposed areas conforming to a desired circuit pattern, electroplating conductive metallic material on the exposed portions of said metallic film to form electrical conductors in the desired circuit pattern, selectively removing the masked portions of said metallic film from said insulating base, and heating said insulating base and said conductors thereon at an elevated temperature for a time sufficient to advance the cure of said adhesive material to a final condition achieved in the processing, with at least the major portion of the curing being accomplished by applying heat to the insulating base over the entire area which corresponds to the circuit pattern from a volume of molten solder from which solder is applied to solderable portions of the assembly for connecting electrical components provided on said base to portions of the conductors thereon.

5. A process for use in producing a circuit assembly whereby metallic material which is deposited on an insulating base is secured to the base by adhesive material during and after deposition of the metal, said method comprising applying continuously over at least one side of the insulating base a thermosetting adhesive material comprising phenolic resin, synthetic rubber, and a vaporizable solvent with the adhesive material being in an uncured condition at the time it is applied to the base, heating the adhesive coated base at an elevated temperature for a time sufficient to evaporate such solvent material and partially cure the adhesive material to a condition in which it is adherent both to the insulating base and to metallic material, subsequently forming a continuous metallic film on said partially cured adhesive material by chemical metallization, with the partially cured adhesive material firmly securing the metallic material to the base while the metallic material is being deposited and thereafter, applying resist material to selected proportions of said metallic film so as to leave predetermined areas of said film exposed, with the exposed areas conforming to a desired circuit pattern, electroplating conductive metallic material on the exposed portions of said metallic film to form electrical conductors in the desired circuit pattern, selectively removing the resist material and the underlying portions of said metallic film from said insulating base, and heating said insulating base and said conductors thereon at a temperature above 350° F. for a time sufficient to advance the cure of said adhesive material to a final condition of cure in which the adhesive material secures the conductors to the insulating base sufficiently firmly that the assembly is useable, with at least the major portion of the curing being accomplished by contacting one side of the insulating base over the entire area which corresponds to the circuit pattern with molten solder which connects electrical components provided on said base to portions of the conductors thereon.

References Cited in the file of this patent

UNITED STATES PATENTS

| | | |
|---|---|---|
| 2,139,640 | Mall | Dec. 6, 1938 |
| 2,316,149 | Bates | Apr. 13, 1943 |
| 2,637,404 | Bart | May 5, 1953 |
| 2,695,351 | Beck | Nov. 23, 1954 |
| 2,699,425 | Nieter | Jan. 11, 1955 |
| 2,728,693 | Cado | Dec. 27, 1955 |
| 2,734,150 | Beck | Feb. 7, 1956 |
| 2,740,193 | Pessel | Apr. 3, 1956 |
| 2,749,382 | Lockhard | June 5, 1956 |
| 2,777,192 | Albright et al. | Jan. 15, 1957 |

OTHER REFERENCES

"Metallizing Non-Conductors" by Samuel Wein. Metal Industry Publishing Company, New York. Pages 24–50. (Copy in 29–472.9.)